US011205117B2

(12) United States Patent
Kim

(10) Patent No.: US 11,205,117 B2
(45) Date of Patent: Dec. 21, 2021

(54) NEUROMORPHIC DEVICE HAVING A PLURALITY OF SYNAPSES BLOCKS

(71) Applicant: SK hynix Inc., Icheon (KR)

(72) Inventor: Seong-Hyun Kim, Suwon-si (KR)

(73) Assignee: SK HYNIX INC., Icheon-si (KR)

( * ) Notice: Subject to any disclaimer, the term of this patent is extended or adjusted under 35 U.S.C. 154(b) by 961 days.

(21) Appl. No.: 15/912,757

(22) Filed: Mar. 6, 2018

(65) Prior Publication Data

US 2019/0019081 A1    Jan. 17, 2019

(30) Foreign Application Priority Data

Jul. 13, 2017    (KR) .................... 10-2017-0088877

(51) Int. Cl.
*G06N 3/063*    (2006.01)
*G06N 3/08*    (2006.01)
(Continued)

(52) U.S. Cl.
CPC .......... *G06N 3/063* (2013.01); *G06N 3/0481* (2013.01); *G06N 3/0635* (2013.01); *G06N 3/08* (2013.01); *G11C 11/54* (2013.01); *G11C 13/003* (2013.01); *G11C 13/0007* (2013.01); *G11C 13/0023* (2013.01); *G11C 13/0026* (2013.01); *G11C 13/0028* (2013.01); *G06N 3/049* (2013.01); *G11C 2213/15* (2013.01); *G11C 2213/76* (2013.01); *G11C 2213/77* (2013.01); *G11C 2213/79* (2013.01)

(58) Field of Classification Search
CPC ........ G06N 3/063; G06N 3/0635; G06N 3/08;
G06N 3/0481; G06N 3/049; G11C 13/0028; G11C 13/0026; G11C 13/0023; G11C 13/003; G11C 13/0007; G11C 11/54; G11C 2213/76; G11C 2213/15; G11C 2213/77; G11C 2213/79
See application file for complete search history.

(56) References Cited

U.S. PATENT DOCUMENTS 9,576,616 B2    2/2017  Nazarian et al.
10,332,004 B2 *  6/2019  Kataeva ................ G06F 11/079
(Continued)

FOREIGN PATENT DOCUMENTS

| CN | 102723112 A | 10/2012 |
| CN | 104756193 A | 7/2015 |
| WO | 2015167477 A1 | 11/2015 |

OTHER PUBLICATIONS

"Application Research of Memristor and its Crossbar Array in Data Reading-Writing and Image Recognition" College of Computer Science of Chongqing University, Chongqing, China Oct. 2015.
(Continued)

*Primary Examiner* — Ajay Ojha

(57) ABSTRACT

Neuromorphic devices are described. A neuromorphic device may include a pre-synaptic neuron; row lines extending from the pre-synaptic neuron in a first direction; a post-synapse neuron; a column line extending from the post-synaptic neuron in a second direction perpendicular to the first direction; and synapses disposed in intersection regions between the row lines and the column line. The synapses may include a first synapse having a first memristor; and a second synapse having a first selection device and a second memristor.

20 Claims, 8 Drawing Sheets

(51) Int. Cl.
*G11C 13/00* (2006.01)
*G06N 3/04* (2006.01)
*G11C 11/54* (2006.01)

(56) References Cited

U.S. PATENT DOCUMENTS

| | | | |
|---|---|---|---|
| 10,650,308 B2 * | 5/2020 | Ielmini | G06N 3/063 |
| 2009/0140229 A1 * | 6/2009 | Sandoval | H01L 45/1233 |
| | | | 257/3 |
| 2017/0083810 A1 | 3/2017 | Ielmini et al. | |
| 2020/0193300 A1 * | 6/2020 | Kumar | G11C 13/0069 |

OTHER PUBLICATIONS

"A Neuromorphic ASIC Design Using One-Selector-One-Memristor Crossbar". Bona Yan et al. 2016 Electrical and Computing Engineering, University of Pittsburgh, Pittsburgh, PA, USA., Electrical and Computing Engineering, University of Massachusetts, MA, USA., Air Force Research Laboratory, Rome, NY, USA.

"PCMO-Based RRAM and NPN Bipolar Selector as Synapse for Energy Efficient STDP", S. Lashkara et al. IEEE Electron Device Letters, vol. 38, No. 9, Sep. 2017.

"Memristor-based Coupling Connection Characteristics and Synaptic Circuit Design". Prof. Lidan Wang Southwest University,China. 2016.

Office Action from National Intellectual Property Administration of People's Republic of China for Chinese Application No. 201810586174.9 dated Jul. 5, 2021.

* cited by examiner

ND A
PLURALITY OF SYNAPSES BLOCKS

NEUROMORPHIC DEVICE HAVING A PLURALITY OF SYNAPSES BLOCKS

CROSS-REFERENCE TO RELATED APPLICATIONS

The present patent application claims priority under 35 U.S.C. § 119(a) to Korean Patent Application No. 10-2017-0088877, filed on Jul. 13, 2017, which is incorporated herein by reference in its entirety.

BACKGROUND

1. Field

The present disclosure relates to a neuromorphic device having a plurality of synapse blocks.

2. Description of the Related Art

Recently, much attention has been paid to devices in the field of neuromorphic technology, which use chips to mimic the human brain. A neuromorphic device based on the neuromorphic technology includes a plurality of pre-synaptic neurons, a plurality of post-synaptic neurons, and a plurality of synapses. The neuromorphic device outputs pulses or spikes having various levels, amplitudes, and/or times, according to a learning state of the neuromorphic device.

SUMMARY

Embodiments of the present disclosure provide a neuromorphic device having a plurality of synapse blocks.

Other embodiments of the present disclosure include a neuromorphic device having synapses being partially or wholly performed according to an operation voltage.

Further embodiments of the present disclosure include a neuromorphic device having synapses being partially or wholly used according to a size of a data pattern.

The objectives of the present disclosure are not limited to the above-mentioned objectives and embodiments. Other objectives and embodiments may be understood by those skilled in the art in light of the present disclosure.

In an embodiment of the present disclosure, a neuromorphic device may include a pre-synaptic neuron, row lines extending from the pre-synaptic neuron in a first direction, a post-synaptic neuron, a column line extending from the post-synaptic neuron in a second direction perpendicular to the first direction, and a plurality of synapses disposed in intersection regions between the row lines and the column line.

In an embodiment of the present disclosure, a neuromorphic device may include a pre-synaptic neuron, first row lines and second row lines extending in parallel from the pre-synaptic neuron in a first direction, a post-synaptic neuron, column lines extending from the post-synaptic neuron in a second direction at an angle to the first direction; and synapse blocks disposed in intersection regions between the first and second row lines and the column lines.

In an embodiment of the present disclosure, a neuromorphic device may include a pre-synaptic neuron, a first row line and a second row line extending in parallel from the pre-synaptic neuron in a first direction, a post-synaptic neuron, a column line extending from the post-synaptic neuron in a second direction at an angle to the first direction, a first synapse disposed in a first intersection region between the first row line and the column line, and a second synapse disposed in a second intersection region between the second row line and the column line.

DETAILED DESCRIPTION

Figure 1:
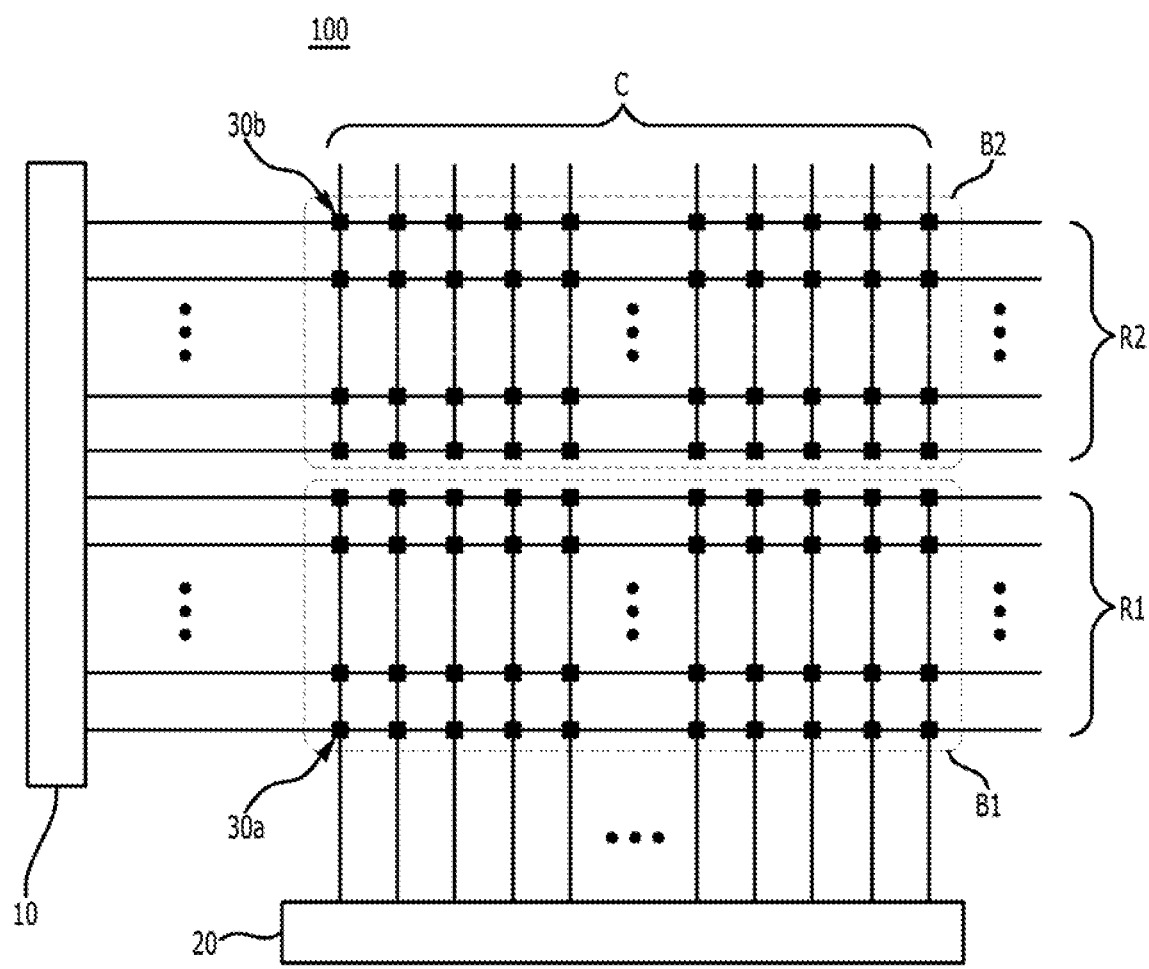
FIG. 1 is a diagram schematically illustrating a synapse array of a neuromorphic device in accordance with an embodiment of the present disclosure.

Various embodiments will be described below in more detail with reference to the accompanying drawings. Embodiments of the present disclosure may, however, have different forms and should not be construed as limited to the embodiments set forth herein. Rather, these embodiments are provided so that this disclosure will be thorough and complete, and will fully convey the scope of the claims to those skilled in the art.

Throughout the specification, like reference numerals refer to the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

In this specification, 'potentiating,' 'setting,' 'learning,' and 'training' may be used as the same or similar terms, and 'depressing,' 'resetting,' and 'initiating' may be used as the same or similar terms. For example, an operation of lowering resistances of synapses may be described as potentiating, setting, learning, or training, and an operation of increasing the resistances of synapses may be described as depressing, resetting, or initiating. Furthermore, when synapses are potentiated, set, or trained, a gradually increasing voltage/current may be outputted because the conductivities of the synapses are increased. On the other hand, when synapses are depressed, reset, or initiated, a gradually decreasing voltage/current may be outputted because the conductivities of the synapses are decreased. For convenience of description, the terms 'data pattern,' 'electrical signal,' 'pulse,' 'spike,' and 'fire' may have the same, a similar, or a compatible meaning. Furthermore, the terms 'voltage' and 'current' may also be interpreted as having the same or a compatible meaning.

FIG. 1 is a diagram schematically illustrating a synapse array 100 of a neuromorphic device in accordance with an embodiment of the present disclosure. Referring to FIG. 1, a synapse array 100 of a neuromorphic device in accordance with an embodiment of the present disclosure may include a pre-synaptic neuron 10, a plurality of first row lines R1, a plurality of second row lines R2, a post-synaptic neuron 20, a plurality of column lines C, a first synapse block B1 having a plurality of first synapses 30a, and a second synapse block B2 having a plurality of second synapses 30b. The pre-synaptic neuron 10 and the post-synaptic neuron 20 may include one or more circuits that are used or designed for use in biomimetic or neuromorphic applications, or that have biomimetic or neuromorphic characteristics or properties.

The first row lines R1 and the second row lines R2 may extend from the pre-synaptic neuron 10 in a first direction, i.e., a row direction, and in parallel with each other. The column lines C may extend from the post-synaptic neuron 20 in a second direction, i.e., a column direction, and in parallel with each other. The first synapses 30a may be disposed in intersection regions between the first row lines R1 and the column lines C, and the second synapses 30b may be disposed in intersection regions between the second row lines R2 and the column lines C. The first synapse block B1 and the second synapse block B2 may be connected to the first row lines R1 and the second row lines R2, respectively, and commonly connected to the column lines C. That is, the first synapse block B1 and the second synapse block B2 may share the same column lines C.

The circuits in pre-synaptic neuron 10 may independently selectively transmit various electrical signals to the first synapses 30a in the first synapse block B1 through the first row lines R1 and the second synapses 30b in the second synapse block B2 through the second row lines R2 in a learning mode, a reset mode, or a read-out mode.

The post-synaptic neuron 20 may transmit electrical signals to the first synapses 30a in the first synapse block B1 and to the second synapses 30b in the second synapse block B2 through the column lines C in the learning mode or the reset mode. The post-synaptic neurons 20 may receive electrical signals from the first synapses 30a in the first synapse block B1 and the second synapses 30b in the second synapse block B2 in the read-out mode.

Figure 2A:
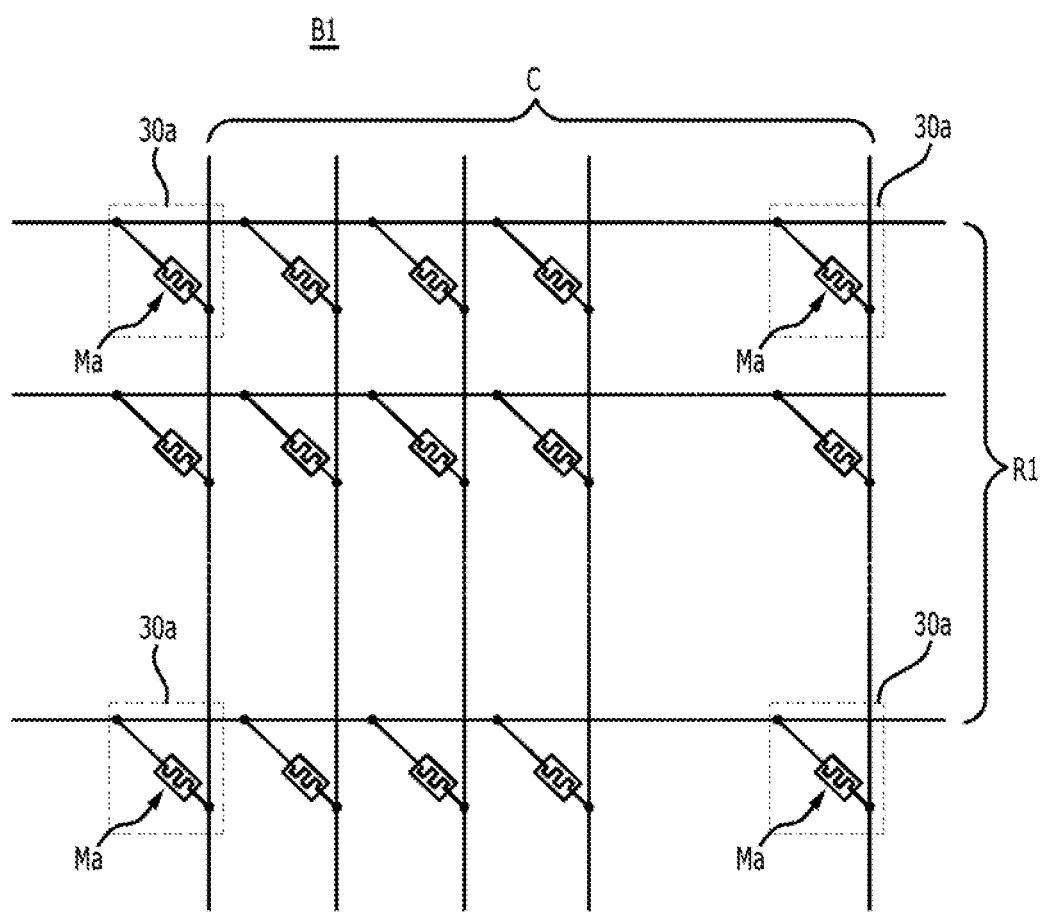
FIG. 2A is a diagram schematically illustrating a portion of a first synapse block of a synapse array of a neuromorphic device in accordance with an embodiment of the present disclosure.

FIG. 2A is a diagram schematically illustrating a portion of a first synapse block B1 of a synapse array 100 of a neuromorphic device in accordance with an embodiment of the present disclosure. Referring to FIG. 2A, a first synapse 30a in accordance with an embodiment of the present disclosure may include a first memristor Ma having a plurality of resistance levels. A first electrode of the first memristor Ma may be electrically and directly connected to a first row line R1 and a second electrode of the first memristor Ma may be electrically and directly connected to a column line C. The first memristor Ma may include a resistive memory element that can be a resistive layer with at least one of a transition metal oxide, perovskite metal oxide, ferroelectric material, or ferromagnetic material or a phase change memory device that includes a chalcogenide based material. A resistance state of the first memristor Ma may be gradually changed from a high resistance state (HRS) to a low resistance state (LRS), or vice versa, in accordance with pulses input from the pre-synaptic neurons 10 and/or the post-synaptic neurons 20. The first memristor Ma may include a variable resistive element. The resistance state of the first memristor Ma may be changed or altered in response to the number of the input pulses, different time periods between the input pulses or input pulse frequency, duration of the input pulses, and/or voltage or amplitude differences in the input pulses. The various electrical signals may vary according to input data patterns.

Figure 2B:
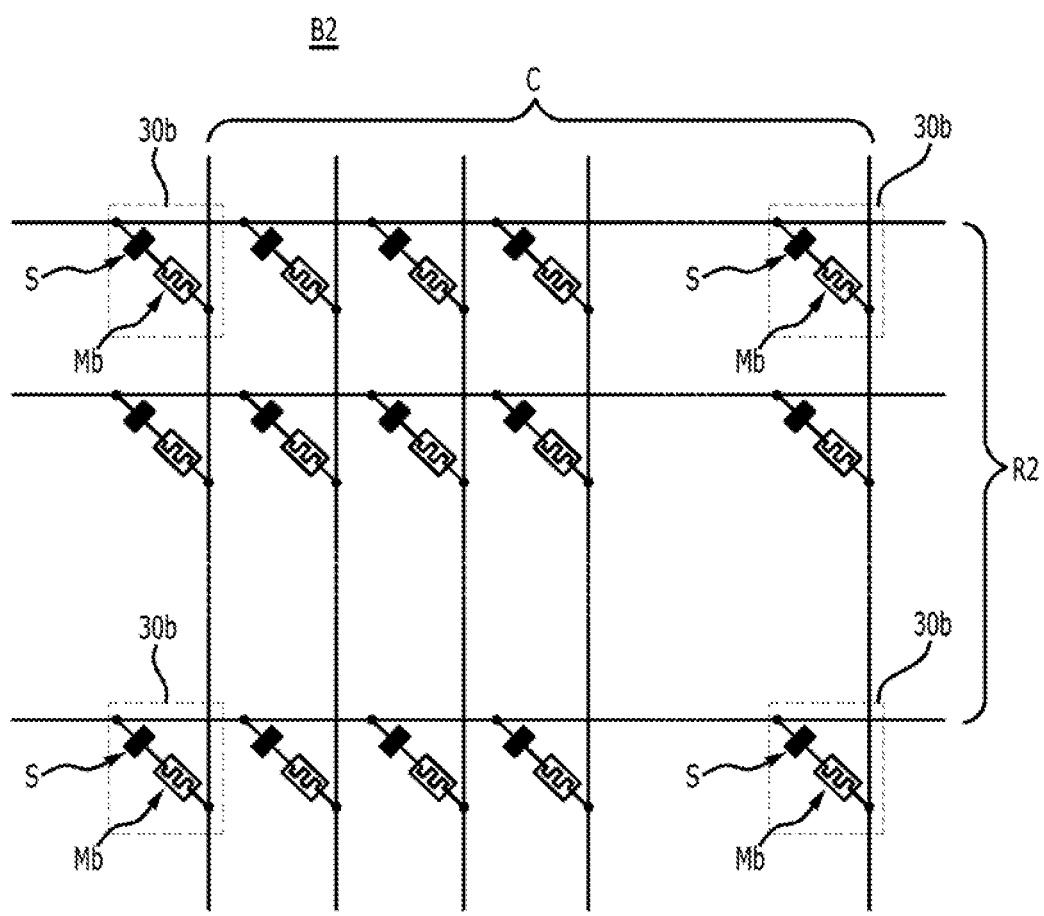
FIG. 2B is a diagram schematically illustrating a portion of a second synapse block of a synapse array of a neuromorphic device in accordance with an embodiment of the present disclosure.

FIG. 2B is a diagram schematically illustrating a portion of a second synapse block B2 of a synapse array 100 of a neuromorphic device in accordance with an embodiment of the present disclosure. Referring to FIG. 2B, a second synapse 30b may include a selection device S and a second memristor Mb. A first electrode of the selection device S may be electrically and directly connected to a second row line R2 and a second electrode of the selection device S may be electrically and directly connected to a first electrode of the second memristor Mb. A second electrode of the second memristor Mb may be electrically and directly connected to the column line C. The second memristor Mb may include a resistive memory element that can be a resistive layer with at least one of a transition metal oxide, perovskite metal oxide, ferroelectric material, or ferromagnetic material or a phase change memory device that includes a chalcogenide based material.

The selection device S can perform a switch function. When a voltage higher than a threshold voltage Vth of the selection device S is applied to the selection device S, the selection device S may be turned-on. Accordingly, electrical signals can be transmitted from a pre-synaptic neuron 10 to the second memristor Mb through the selection device S.

When a voltage lower than the threshold voltage Vth of the selection device is applied to the selection device S, the selection device S may be turned-off. Accordingly, electrical signals transmitted from a pre-synaptic neuron 10 to the second memristor Mb through may be blocked. That is, when a voltage lower than the threshold voltage Vth of the selection device S is applied, the selection device S can operate as an insulator by being turned-off, and when a voltage higher than the threshold voltage Vth of the selection device S is applied, the selection device S can operate as a conductor by being turned-on.

The selection device S may include at least one of a metal-insulator transition material (MIT) such as a vanadium di-oxide ($VO_2$) or a niobium oxide ($NbO_2$), or an Ovonic Threshold Switch (OTS), or bi-directional materials or devices. Examples of bi-directional materials or devices include bi-directional two-electrode switching devices, a mixed ionic electronic conduction material (MIEC), a metal-insulator-metal stack (MIM) stack, or a Zener diode switch. The Zener diode switch may include a single Zener diode switch with one Zener diode, or a multi-Zener diode switch with two or more Zener diodes. In the multi-Zener diode switch, the two or more Zener diodes may be arranged to face each other or to be opposite to each other. Since the selection device S may include a bi-directional two-electrode switching device to pass or block currents flowing in both directions, the selection device S may perform an STDP (Spike Timing Dependent Plasticity) operation to set/reset resistances or conductance of second synapses 30b.

Figure 3A:
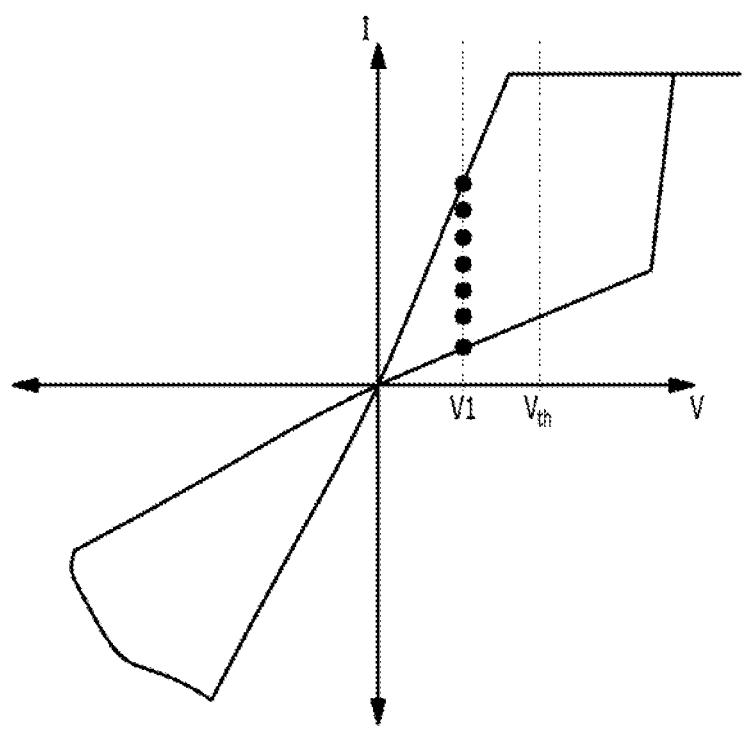
FIG. 3A is a graph schematically illustrating a voltage-current curve showing input/output characteristics of the first synapse in the first synapse block of the synapse array of the neuromorphic device accordance with the embodiment of the present disclosure.
Figure 3B:
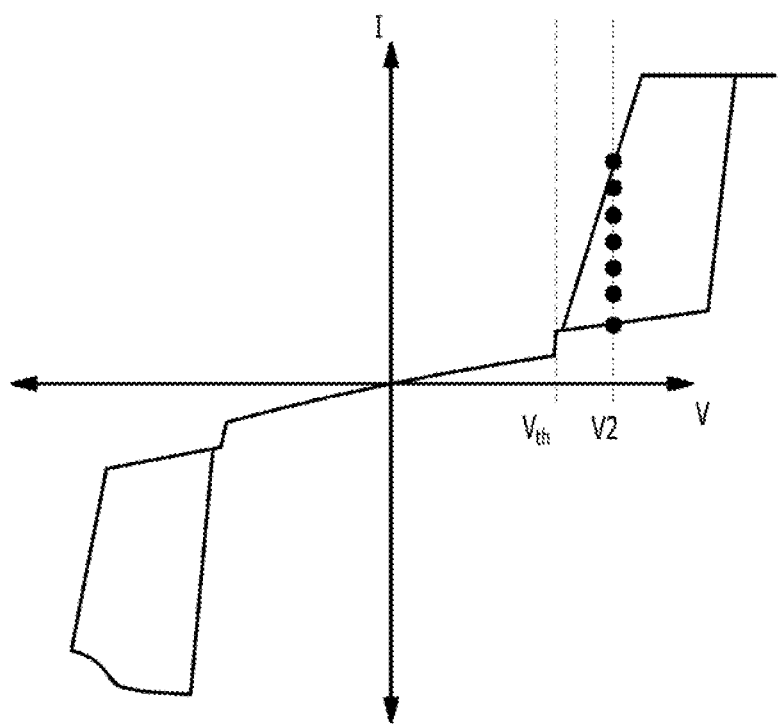
FIG. 3B is a graph schematically illustrating a voltage-current curve showing the input/output characteristics of the second synapse in the second synapse block of the synapse array of the neuromorphic device in accordance with the embodiment of the present disclosure.

FIG. 3A is a graph schematically illustrating an example of a voltage-current curve showing input/output characteristics of a first synapse 30a in the first synapse block B1 of the synapse array 100 of the neuromorphic device accordance with the embodiment of the present disclosure, and FIG. 3B is a graph schematically illustrating an example of a voltage-current curve showing the input/output characteristics of a second synapse 30b in the second synapse block B2 of the synapse array 100 of the neuromorphic device in accordance with embodiments of the present disclosure.

Referring to FIGS. 2A and 3A, the first synapse 30a may be activated and operate over the entire voltage range regardless of a threshold voltage Vth of the selection device S. For example, in a programming mode such as the learning mode, the set mode, the reset mode, an enhancement mode, or an inhibition mode, the first memristor Ma of the first synapse 30a may be set/reset or enhanced/inhibited by electrical signals or electrical pulses along the voltage range in FIG. 3A. In the read-out mode, the first synapse 30a may transmit or output a synapse weight (e.g., voltage or current) depending on a resistance level of the first memristor Ma according to a first operating voltage V1 lower than a threshold voltage Vth of the selection device S. FIG. 3A illustrates an example in which the first memristor Ma of the first synapse 30a has a plurality of potential resistance levels at the first operating voltage V1 that is lower than the threshold voltage Vth of the selection device S. As reflected in the voltage-current curve in FIG. 3A, the first synapse 30a can also be activated in an operation voltage region higher than the threshold voltage Vth of the selection device S.

Referring to FIGS. 2B and 3B, a second synapse 30b may be activated and operate in an operation voltage region higher than the threshold voltage Vth of the selection device S. For example, when a voltage lower than the threshold voltage Vth of the selection device S is applied to the second synapse 30b, such as, the first operation voltage V1 shown in FIG. 3A is applied, the selection device S of the second synapse 30b may be turned-off, so that the second synapse 30b may be in an inactivated state and may not substantially operate. In comparison, in a programming mode such as the learning mode, the set mode, the reset mode, the enhancement, or the inhibition mode, the second synapse 30b may be set/reset or enhanced/inhibited by electrical signals or electrical pulses having an operating voltage higher than the threshold voltage Vth of the selection device S. In the read-out mode, the second synapse 30b may transmit or output a synapse weight (e.g., voltage or current) according to a resistance level of the second memristor Mb corresponding to an operating voltage higher than the threshold voltage Vth of the selection device S. FIG. 3B illustrates an example in which second memristor Mb of the second synapse 30b has a plurality of resistance levels at a second operating voltage V2 that is higher than the threshold voltage Vth of the selection device S.

Referring to FIGS. 1 to 3B, when a first operation voltage lower than the threshold voltage Vth of the selection device S is applied to the first synapses 30a in the first synapse block B1 and the second synapses 30b in the second synapse block B2 from the pre-synaptic neuron 10, some or all of the first memristors Ma of the first synapses 30a in the first synapse block B1 may be activated (i.e., turned-on) and the second memristors Mb of the second synapses 30b in the second synapse block B2 may be inactivated (i.e., turned-off). That is, only a portion (i.e., the turned-on first synapses 30a in the first synapse block B1) of the synaptic array 100 of the neuromorphic device are used.

Specifically, when the data pattern to be stored in the synapse array 100 of the neuromorphic device is smaller, the first synapses 30a in the first synapse block B1 may be used in connection with a first operating voltage lower than the threshold voltage Vth of the selection device S. Alternatively, when the data pattern to be stored in the synaptic array 100 of the neuromorphic device is larger, the first synapses 30a in the first synapse block B1 and the second synapses 30b in the second synapse block B2 may be used in connection with a second operation voltage higher than the threshold voltage Vth of the selection device S. In this manner, the synapse array 100 can be efficiently used and power consumption is reduced due to a relatively lower operating voltage less than Vth. When the second operating voltage is relatively higher than the first operating voltage, the synaptic weights from both first synapses 30a and second synapses 30b are transmitted or output resulting in a larger or greater voltage or current output. Therefore, when the data pattern is larger, data recognition errors can be reduced in both programming and read-out modes.

Figure 4:
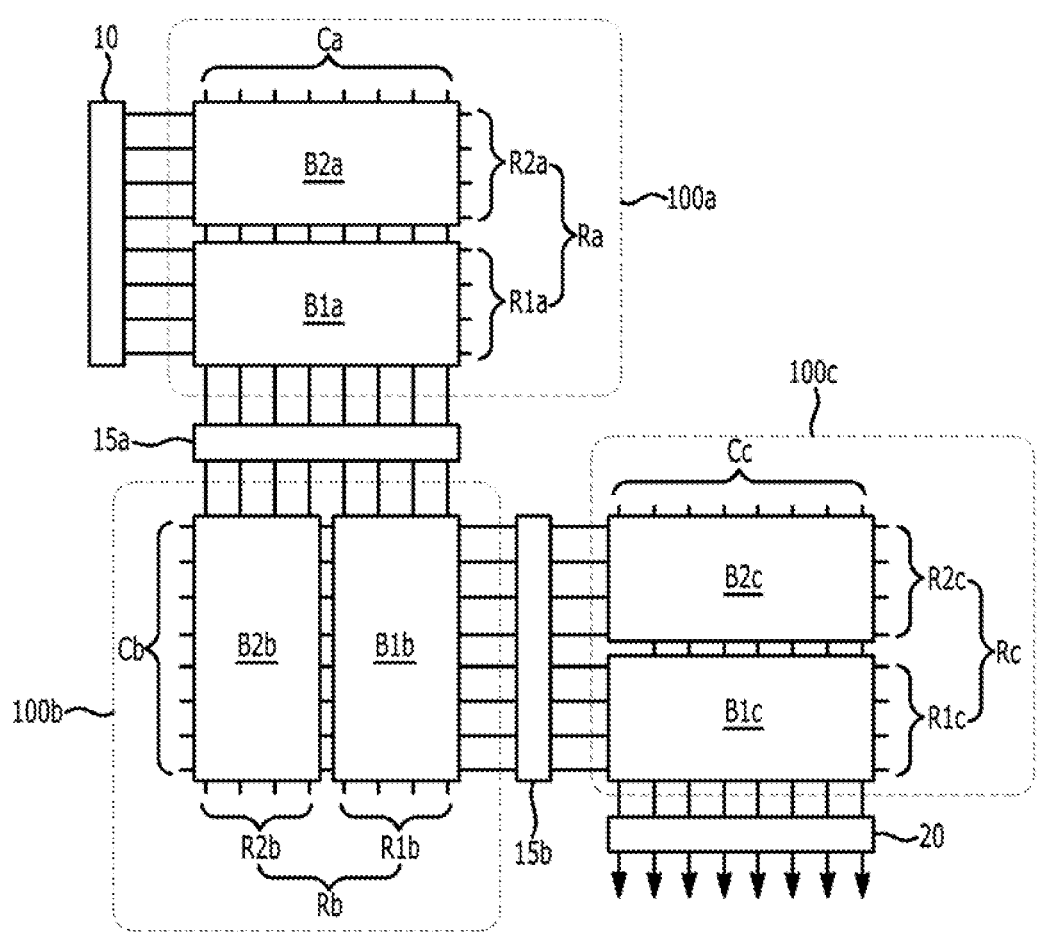
FIG. 4 is a diagram schematically illustrating a synaptic network of a neuromorphic device in accordance with an embodiment of the present disclosure.

FIG. 4 is a diagram schematically illustrating a synaptic network of a neuromorphic device in accordance with an embodiment of the present disclosure. Referring to FIG. 4, the synaptic network of a neuromorphic device may include a plurality of synaptic arrays 100a-100c which are electrically connected in serial. Synaptic arrays 100a-100c may have substantially the same structure as synaptic array 100 described above and with reference to FIG. 1. Specifically, the synaptic network of the neuromorphic device may include a pre-synaptic neuron 10, a first synapse array 100a, a first inter-synaptic neuron 15a, a second synapse array 100b, a second inter-synaptic neuron 15b, a third synapse array 100c, and a post-synaptic neuron 20. The first synapse array 100a may include a first synapse block B1a and a second synapse block B2a, and the second synapse array 100b may include a first synapse block B1b and a second synapse block B2b, and the third synapse array 100c may include a first synapse block B1c and a second synapse block B2c. In another embodiment of the present disclosure, the synaptic network may include more than three synaptic arrays.

The pre-synaptic neuron 10 and the first synapse array 100a may be electrically connected through a first row line set Ra. Specifically, the pre-synaptic neuron 10 and the first synapse block B1a of the first synapse array 100a may be electrically connected through first row lines R1a, and the pre-synaptic neurons 10 and the second synapse block B2a of the first synapse array 100a may be electrically connected through second row lines R2a. The first synapse block B1a and the second synapse block B2a of the first synapse array 100a may be connected to the first inter-synaptic neuron 15a through a first column line set Ca, in common. The first inter-synaptic neuron 15a may include a post-synaptic neuron of the first synapse array 100a and/or a pre-synaptic neuron of the second synapse array 100b.

The first inter-synaptic neuron 15a and the second synapse array 100b may be electrically connected through a second row line set Rb. Specifically, the first inter-synaptic neuron 15a and the first synapse block B1b of the second synapse array 100b may be electrically connected through first row lines R1b of a second row line set Rb, and the second inter-synaptic neuron 15b and the second synapse block B2b of a second synapse array 100b may be electrically connected through second row lines R2b of the second row line set Rb. The first synapse block B1b and the second synapse block B2b of the second synapse array 100b may be electrically connected to the second inter-synaptic neuron 15b through a second column line set Cb, in common. The second inter-synaptic neuron 15b may include a post-synaptic neuron of the second synapse array 100b and/or a pre-synaptic neuron of the third synapse array 100c.

The second inter-synaptic neuron 15b and the third synapse array 100c may be electrically connected through a third row line set Rc. Specifically, the second inter-synaptic neuron 15b and the first synapse block B1c of the third synapse array 100c may be electrically connected through first row lines R1c of the third row line set Rc, and the second inter-synaptic neuron 15b and the second synapse block B2c of the third synapse array 100c may be electrically connected through second row lines R2c of the third row line set Rc. The first synapse block B1c and the second synapse block B2c of the third synapse array 100c may be electrically connected to the post-synaptic neuron 20 through a third set of column lines Cc, in common.

Figure 5:
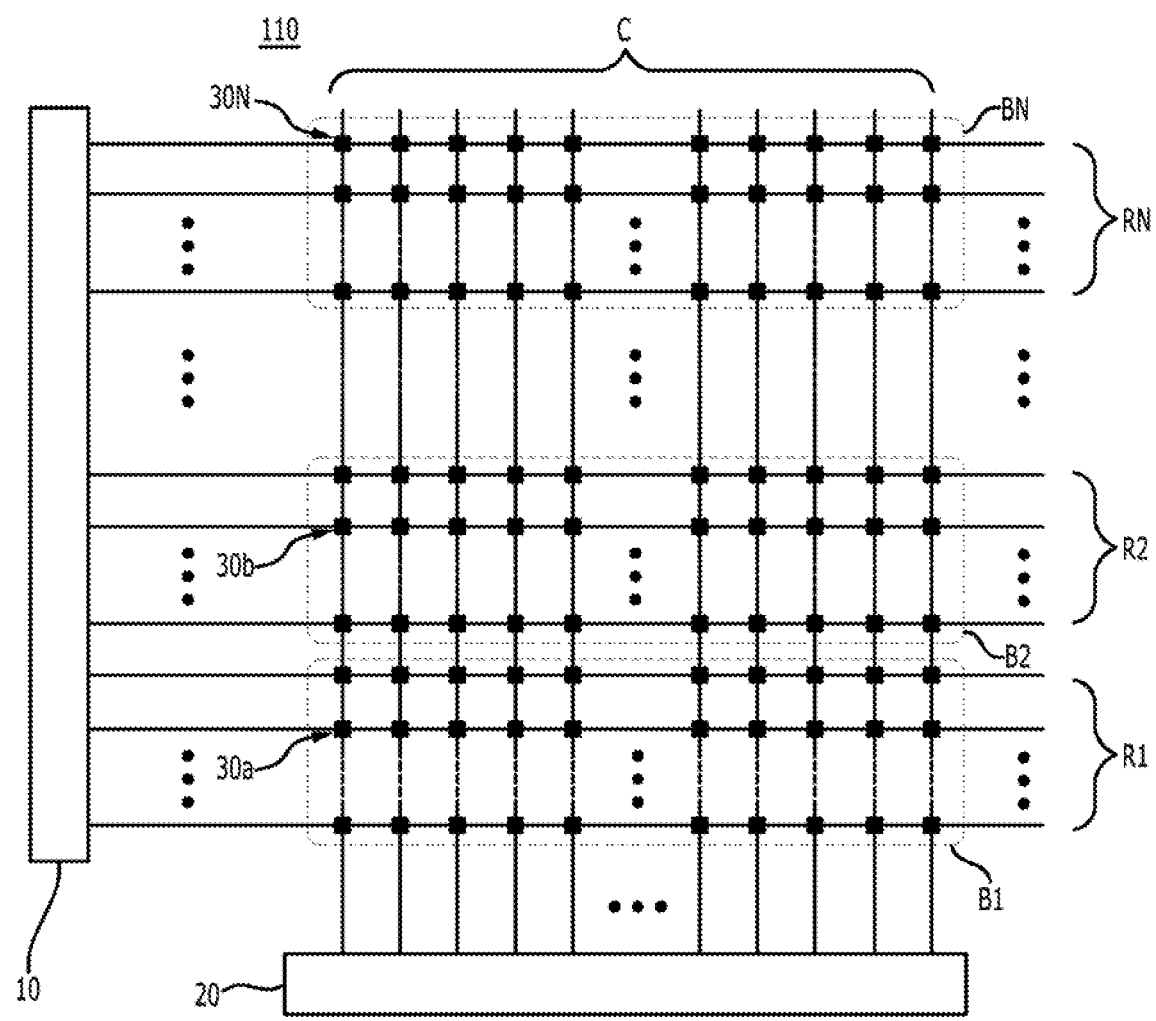
FIG. 5 is a diagram schematically illustrating a synapse array of a neuromorphic device in accordance with an embodiment of the present disclosure.

FIG. 5 is a diagram schematically illustrating a synapse array 110 of a neuromorphic device in accordance with an embodiment of the present disclosure. Referring to FIG. 5, a synaptic array 110 of a neuromorphic device in accordance with an embodiment of the present disclosure may include a pre-synaptic neuron 10, a plurality of first to Nth row lines R1-RN, a post-synaptic neuron 20, a plurality of column lines C, and a plurality of first to Nth synapse blocks B1-BN. The plurality of first to Nth sets of row lines R1-RN may extend from the pre-synaptic neuron 10 in a first direction (i.e., a row direction) in parallel. The plurality of column lines C may extend from the post-synaptic neuron 20 in a second direction perpendicular to the first direction (i.e., column direction) in parallel. The first synapse block B1 may include a plurality of first synapses 30a disposed in intersection regions between the first row lines R1 and the column lines C. The second synapse block B2 may include a plurality of second synapses 30b disposed in intersection regions between the second row lines R2 and the column lines C. The Nth synapse block BN may include a plurality of 30N synapses disposed in intersection regions between the Nth row lines RN and the column lines C (where N is an integer greater than 2). That is, the first to Nth synapse blocks B1 to BN may be connected to the first to Nth row lines R1 to RN, respectively, and may share the same column lines C.

Each of the first synapses 30a of the first synapse block B1 may include a first memristor Ma. Each of the second synapses 30b of the second synapse block B2 may include both a selection device S and a second memristor Mb. Each of the Nth synapses 30N of the Nth synapse block BN may include a selection device Sx and an Nth memristor MN. The selection device Sx may have a threshold voltage Vthx different from the threshold voltage Vth of the selection device S of the second synapses 30b.

Figure 6:
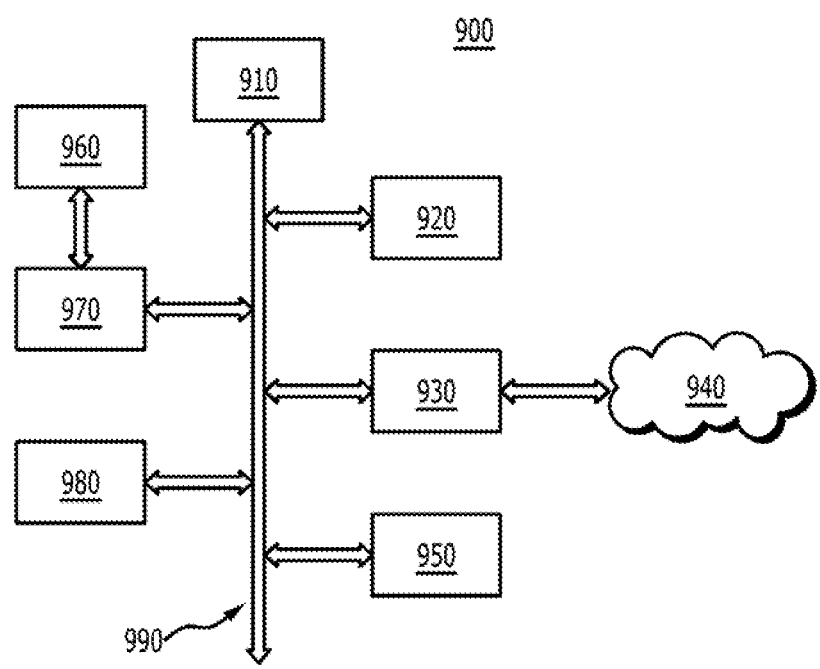
FIG. 6 is a diagram schematically illustrating a pattern recognition system in accordance with an embodiment of the present disclosure.

That is, the synaptic array 110 of the neuromorphic device in accordance with an embodiment of the present disclosure may include the synapse blocks B2 to BN including the various synapses 30b to 30N. The synapses 30b to 30N may include the selection devices S having various threshold voltages Vth, respectively. Therefore, during an operation of in the neuromorphic device, some or all of the plurality of synapse blocks B1 to BN may be selectively used depending on the size of the data pattern. In another embodiment of the present invention, the first synapse 30a of the first synapse block B1 may also include the selection device S. FIG. 6 is a diagram schematically illustrating a pattern recognition system in accordance with an embodiment of the present disclosure. For example, a pattern recognition system 900 may include a speech recognition system, an imaging recognition system, a code recognition system, a signal recognition system, and one or more systems for recognizing various patterns.

Referring to FIG. 6, in an embodiment of the present disclosure, the pattern recognition system 900 may include a Central Processing Unit (CPU) 910, a memory unit 920, a communication control unit 930, a network 940, an output unit 950, an input unit 960, an Analog-Digital Converter (ADC) 970, a neuromorphic unit 980, and/or a bus 990. The CPU 910 may generate and transmit various signals for a learning process of the neuromorphic unit 980, and perform various processes and functions for recognizing patterns according to an output from the neuromorphic unit 980. For example, the CPU 910 may perform processes and functions for recognizing a speech and imaging patterns based on the output from the neuromorphic unit 980.

The CPU 910 may be connected to the memory unit 920, the communication control unit 930, the output unit 950, the ADC 970, and the neuromorphic unit 980 through the bus 990. The memory unit 920 may store various pieces of information, which are required to be stored in the pattern recognition system 900. The memory unit 920 may include one or more of a volatile memory device, such as DRAM or SRAM, a nonvolatile memory, such as PRAM, MRAM, ReRAM or NAND flash memory, and various memory units, such as Hard Disk Drive (HDD) and Solid State Drive (SSD).

The communication control unit 930 may transmit and/or receive data to and/or from a communication control unit of another system through the network 940. For example, the communication control unit 930 may transmit speech and/or image recognition data through the network 940.

The output unit 950 may output data in various manners. For example, the output unit 950 may include a speaker, a printer, a monitor, a display panel, a beam projector, a hologrammer, or other various output devices, as non-limiting examples. The output unit 950 may output, for example, speech and/or image recognition data.

The input unit 960 may include any of a microphone, a camera, a scanner, a touch pad, a keyboard, a mouse, a mouse pen, or one or more of various sensors, as non-limiting examples.

The ADC 970 may convert analog data inputted from the input unit 960 into digital data.

The neuromorphic unit 980 may perform learning or recognition using the data outputted from the ADC 970, and output data corresponding to recognized patterns. The neuromorphic unit 980 may include one or more of the neuromorphic devices in accordance with the various embodiments described above.

In accordance with the embodiments of the present disclosure, a synapse array of a neuromorphic device can be partially or wholly used according to a size of a data pattern. Accordingly, a utilization efficiency of the synapse array can be increased, an activation synapse size can be optimized, and a power consumption can be reduced.

Although various embodiments have been described for illustrative purposes, it will be apparent to those skilled in the art that various changes and modifications may be made without departing from the spirit and scope of the disclosure, as defined in the following claims.

What is claimed is:

1. A neuromorphic device comprising:
   a pre-synaptic neuron;
   row lines extending from the pre-synaptic neuron in a first direction;
   a post-synaptic neuron;
   a column line extending from the post-synaptic neuron in a second direction perpendicular to the first direction; and
   a plurality of synapses disposed in intersection regions between the row lines and the column line,
   wherein the plurality of synapses comprises a first synapse having a first memristor; and
a second synapse having a first selection device and a second memristor,
wherein the first synapse does not include any selection devices.

2. The neuromorphic device of claim 1,
wherein the row lines comprise
a first row line connected to the first synapse; and
a second row line connected to the second synapse.

3. The neuromorphic device of claim 2, wherein:
a first electrode of the first memristor is directly electrically connected to the first row line, and
a second electrode of the first memristor is directly electrically connected to the column line.

4. The neuromorphic device of claim 2, wherein:
a first electrode of the first selection device is directly electrically connected to the second row line,
a second electrode of the first selection device is directly electrically connected to a first electrode of the second memristor, and
a second electrode of the second memristor is directly electrically connected to the column line.

5. The neuromorphic device of claim 1,
wherein the first selection device comprises a bi-directional two-electrode device.

6. The neuromorphic device of claim 1,
wherein the first selection device comprises at least one of an Ovonic Threshold Switch (OTS), a metal-insulator transition material (MIT), a mixed ionic electronic conduction material (MIEC), a metal-insulator-metal stack (MIM) stack, or a Zener diode switch.

7. The neuromorphic device of claim 1,
wherein the first synapse and the second synapse are connected to the column line, in common.

8. The neuromorphic device of claim 1,
wherein the first selection device has a threshold voltage.

9. The neuromorphic device of claim 8,
wherein the second synapse is configured to be inactivated in a first operation voltage range lower than the threshold voltage, and activated in a second operation voltage higher than the threshold voltage.

10. The neuromorphic device of claim 9,
wherein the first synapse is configured to be activated in the first operation voltage range lower than the threshold voltage.

11. The neuromorphic device of claim 1, further comprises a third synapse having a second selection device and a third memristor,
wherein the first selection device is configured to be turned-on at a first operation voltage, and the second selection device is configured to be turned-on at a second operation voltage,
wherein the first operation voltage is lower than the second operation voltage.

12. A neuromorphic device comprising:
a pre-synaptic neuron;
first row lines and second row lines extending in parallel from the pre-synaptic neuron in a first direction;
a post-synaptic neuron;
column lines extending from the post-synaptic neuron in a second direction at an angle to the first direction; and
synapse blocks disposed in intersection regions between the first and second row lines and the column lines,
wherein the synapse blocks comprise
a first synapse block to be activated at a first operation voltage; and
a second synapse block to be activated at a second operation voltage higher than the first operation voltage.

13. The neuromorphic device of claim 12, wherein:
the first row lines are electrically connected to the first synapse block, and
the second row lines are electrically connected to the second synapse block.

14. The neuromorphic device of claim 13, wherein:
the first synapse block comprises first synapses each having a first memristor, and
the second synapse block comprises second synapses each having a selection device and a second memristor.

15. The neuromorphic device of claim 14,
wherein the selection device comprises a bi-directional two-electrode switch configured to be turned-off at the first operation voltage and turned-on at the second operation voltage.

16. The neuromorphic device of claim 13,
wherein the column lines are connected to the first synapse block and the second synapse block.

17. A neuromorphic device comprising:
a pre-synaptic neuron;
a first row line and a second row line extending in parallel from the pre-synaptic neuron in a first direction;
a post-synaptic neuron;
a column line extending from the post-synaptic neuron in a second direction at an angle to the first direction;
a first synapse disposed in a first intersection region between the first row line and the column line; and
a second synapse disposed in a second intersection region between the second row line and the column line,
wherein the first synapse comprises a first memristor, and
the second synapse comprises a selection device and a second memristor,
wherein a first electrode of the first memristor is electrically connected to the first row line, and a second electrode of the first memristor is directly electrically connected to the column line,
wherein a first electrode of the selection device is electrically connected to the second row line, a second electrode of the selection device is electrically connected to a first electrode of the second memristor, and a second electrode of the second memristor is directly electrically connected to the column line.

18. The neuromorphic device of claim 17, wherein:
the first electrode of the first memristor is directly electrically connected to the first row line.

19. The neuromorphic device of claim 17, wherein
the first electrode of the selection device is directly electrically connected to the second row line,
and the second electrode of the selection device is directly electrically connected to the first electrode of the second memristor.

20. The neuromorphic device of claim 17, wherein
the selection device is configured to be turned-on at a threshold voltage; and wherein
at an operation voltage lower than the threshold voltage, the first memristor is activated and the second memristor is inactivated.

* * * * *